United States Patent
Kim et al.

(10) Patent No.: US 12,199,115 B2
(45) Date of Patent: Jan. 14, 2025

(54) IMAGE SENSOR

(71) Applicant: Samsung Electronics Co., Ltd., Suwon-si (KR)

(72) Inventors: Jae Hong Kim, Suwon-si (KR); Dae Hwa Paik, Seoul (KR); Seung Hyun Lim, Hwaseong-si (KR); Sin Hwan Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/599,687

(22) Filed: Mar. 8, 2024

(65) Prior Publication Data
US 2024/0213280 A1 Jun. 27, 2024

Related U.S. Application Data

(63) Continuation of application No. 17/502,499, filed on Oct. 15, 2021, now Pat. No. 12,027,541, which is a (Continued)

(30) Foreign Application Priority Data

Aug. 16, 2018 (KR) .................. 10-2018-0095358

(51) Int. Cl.
*H01L 27/146* (2006.01)
*H04N 25/75* (2023.01)
(Continued)

(52) U.S. Cl.
CPC .. *H01L 27/14609* (2013.01); *H01L 27/14603* (2013.01); *H04N 25/75* (2023.01);
(Continued)

(58) Field of Classification Search
CPC ......... H01L 27/14609; H01L 27/14603; H01L 27/14641; H01L 27/14645;
(Continued)

(56) References Cited

U.S. PATENT DOCUMENTS 5,965,871 A 10/1999 Zhou et al.
6,128,039 A 10/2000 Chen et al.
(Continued)

FOREIGN PATENT DOCUMENTS

EP 3253047 A1 12/2017
WO WO-2017/212075 A2 12/2017

OTHER PUBLICATIONS

Korean Office Action dated Aug. 30, 2022 for Korean Application No. KR 10-2018-0095358.

*Primary Examiner* — Nhan T Tran
(74) *Attorney, Agent, or Firm* — Harness, Dickey & Pierce, P.L.C.

(57) ABSTRACT

An image sensor includes a first column line and a second column line configured to extend in a first direction, a plurality of pixel groups configured to connect to the first column line or the second column line and to comprise a plurality of pixels in each of the plurality of pixel groups, a bias circuit configured to comprise a first current circuit and a second current circuit configured to output different bias currents in a first operational mode, and a switching circuit configured to connect the first column line to the first current circuit and connect the second column line to the second current circuit during a first time period, and to connect the first column line to the second current circuit and connect the second column line to the first current circuit during a second time period subsequent to the first time period in the first operational mode.

20 Claims, 15 Drawing Sheets

Related U.S. Application Data continuation of application No. 16/354,593, filed on Mar. 15, 2019, now Pat. No. 11,152,407.

(51) Int. Cl.
    *H04N 25/767*     (2023.01)
    *H04N 25/778*     (2023.01)
    *H04N 25/78*     (2023.01)

(52) U.S. Cl.
    CPC ......... *H04N 25/767* (2023.01); *H04N 25/778* (2023.01); *H04N 25/78* (2023.01)

(58) Field of Classification Search
    CPC . H01L 27/14634; H01L 27/146; H04N 25/75; H04N 25/767; H04N 25/778; H04N 25/78; H04N 25/79; H04N 25/60
    See application file for complete search history.

(56) References Cited

U.S. PATENT DOCUMENTS

| | | |
|---|---|---|
| 6,844,896 B2 | 1/2005 | Henderson et al. |
| 6,914,627 B1 | 7/2005 | Dong |
| 8,102,451 B2 | 1/2012 | Mo et al. |
| 8,248,490 B2 | 8/2012 | Zhang et al. |
| 9,451,192 B2 * | 9/2016 | Chou ................. H04N 25/78 |
| 11,152,407 B2 * | 10/2021 | Kim ................. H01L 27/14603 |
| 2006/0187329 A1 | 8/2006 | Panicacci |
| 2013/0306841 A1 * | 11/2013 | Tate ................. H04N 25/766 250/208.1 |
| 2016/0182848 A1 | 6/2016 | Lim et al. |
| 2017/0302869 A1 * | 10/2017 | Ikuma ................. H04N 25/76 |
| 2020/0382735 A1 * | 12/2020 | Tagawa ............. H01L 27/14645 |

* cited by examiner

IMAGE SENSOR

CROSS-REFERENCE TO RELATED APPLICATION(S)

This application is a continuation application of U.S. application Ser. No. 17/502,499 filed on Oct. 15, 2021, which a continuation application of U.S. application Ser. No. 16/354,593 filed on Mar. 15, 2019, which claims benefit of priority to Korean Patent Application No. 10-2018-0095358 filed on Aug. 16, 2018 in the Korean Intellectual Property Office, the disclosure of each of which is incorporated herein by reference in its entirety.

BACKGROUND

1. Field

Example embodiments of the inventive concepts relate to an image sensor.

2. Description of Related Art

An image sensor is a sensor based on a semiconductor, which receives light and generates an electrical signal. An image sensor may include a pixel array having a plurality of pixels, a logic circuit driving the pixel array and generating an image, and the like. The image sensor may also include a photo diode responding to external light and generating an electric charge, a pixel circuit converting the electric charge generated by the photo diode to an electrical signal, and the like. An image sensor may be widely applied to smartphones, tablet PCs, laptop computers, televisions, vehicles, and others.

SUMMARY

Recently, a variety of techniques have been developed to improve noise properties and an operating speed of an image sensor.

At least some example embodiments of the present inventive concepts are to provide an image sensor capable of shortening a settling time during a readout operation to improve an operating speed thereof and to significantly reduce noise components which may occur during a readout operation.

According to an example embodiment of at least some of the present inventive concepts, an image sensor includes a first column line and a second column line extending in a first direction; a plurality of pixel groups each connected to respective ones of the first column line and the second column line, the plurality of pixel groups each including a plurality of pixels; a bias circuit including a first current circuit and a second current circuit, the first current circuit and the second current circuit configured to output different bias currents in a first operational mode; and a switching circuit configured to operate in the first operational mode to, connect the first column line to the first current circuit and connect the second column line to the second current circuit during a first time period, and connect the first column line to the second current circuit and connect the second column line to the first current circuit during a second time period subsequent to the first time period.

According to another example embodiment of at least some of the present inventive concepts, an image sensor includes a plurality of column lines extending in a first direction and arranged in a second direction; a plurality of pixel groups each including two or more adjacent pixels, the plurality of pixel groups connected to at least one of the plurality of columns; a bias circuit including a plurality of current circuits configured to supply a bias current to the plurality of columns; and a switching circuit connected between the plurality of column lines and the bias circuit, the switching circuit being arranged such that at least a pair of column lines disposed adjacently to each other among the plurality of column lines share one of the plurality of current circuits.

According to another example embodiment of at least some of the present inventive concepts, an image sensor includes a first column line and a second column line extending in a first direction; a plurality of pixels each connected to respective ones of the first column line and the second column line; a bias circuit including, a first current circuit configured to output a first bias current, the first current circuit including a plurality of first transistors, and a second current circuit configured to output a second bias current, the second current circuit including a plurality of second transistors, the plurality of second transistors having substantially a same size as the plurality of first transistors; and a current mirror circuit including, a first current mirror circuit configured to control the first current circuit to output the first bias current, and a second current mirror circuit configured to control the second current circuit to output the second bias current.

BRIEF DESCRIPTION OF DRAWINGS

The above and other aspects, features, and advantages of example embodiments of the present inventive concepts will be more clearly understood from the following detailed description, taken in conjunction with the accompanying drawings, in which.

DETAILED DESCRIPTION

Hereinafter, embodiments of the present inventive concept will be described as follows with reference to the accompanied drawings.

Figure 1:
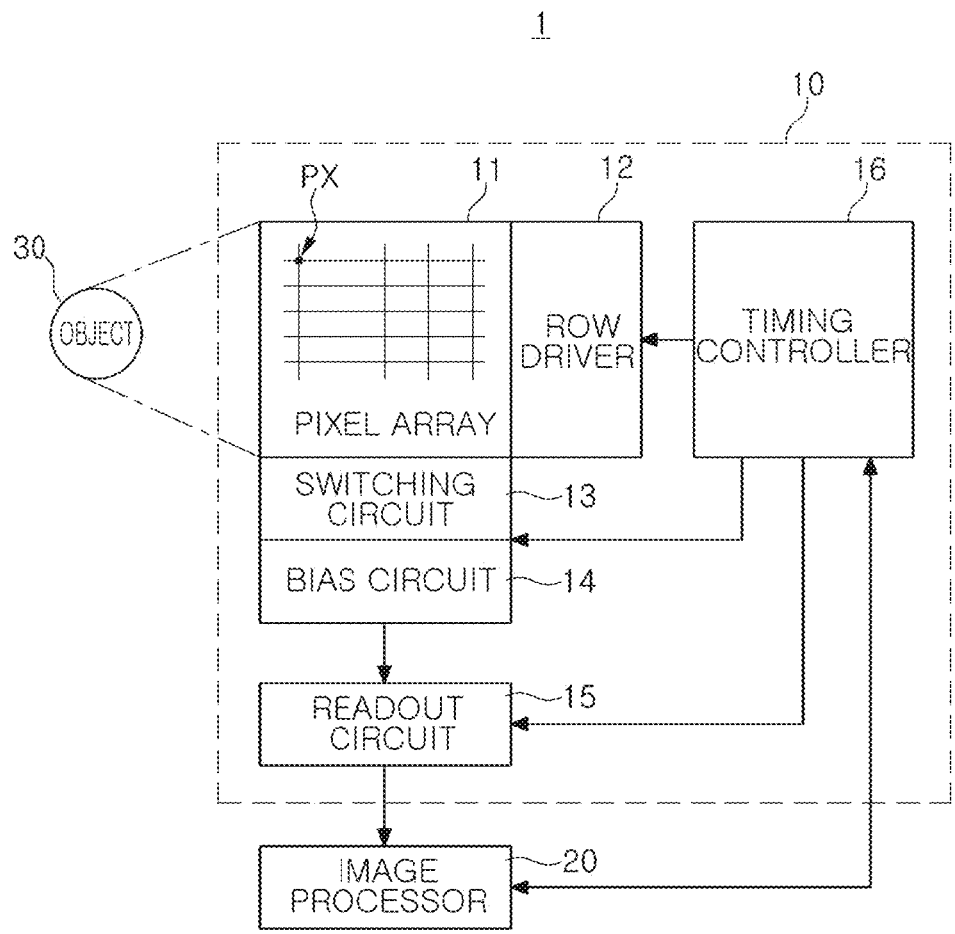
FIG. 1 is a schematic diagram illustrating an image processing device including an image sensor according to an example embodiment in the present inventive concepts.

FIG. 1 is a schematic diagram illustrating an image processing device including an image sensor according to an example embodiment.

Referring to FIG. 1, an image processing device 1 according to an example embodiment may include an image sensor 10 and an image processor 20. The image sensor 10 may include a pixel array 11, a row driver 12, a switching circuit 13, a bias circuit 14, a readout circuit 15, a timing controller 16, and the like. The row driver 12, the switching circuit 13, the bias circuit 14, the readout circuit 15, and the timing controller 16 may be configured to generate image data for controlling the pixel array 11, and may be included in a control logic.

The image sensor 10 may operate in response to a control command received from the image processor 20, and may convert light transferred from an object 30 into an electrical signal and output the electrical signal to the image processor 20. The pixel array 11 included in the image sensor 10 may include a plurality of pixels PX, and the plurality of pixels PX may include a photoelectric device receiving light and generating an electric charge, such as a photo diode PD, for example. In an example embodiment, each of the plurality of pixels PX may include two or more photoelectric devices. Specifically, two or more photoelectric devices may be included in each of the plurality of pixels PX to allow each of the pixels to generate a pixel signal corresponding to a variety of colors of light or to provide an auto focusing function.

Each of the plurality of pixels PX may include a pixel circuit for generating a pixel signal from the electric charge generated by the photo diodes. For example, the pixel circuit may include a transfer transistor, a driving transistor, a selection transistor, and a reset transistor, and the like. The pixel circuit may detect a reset voltage and a pixel voltage from each of the plurality of pixels PX, and obtain a pixel signal by calculating a difference between the voltages. In the pixel voltage, the electric charge generated in the photo diodes included in each of the plurality of pixels PX may be reflected. In an example embodiment, two or more adjacent pixels PX may form a single pixel group, and two or more pixels included in the pixel group may share at least some of the transfer transistor, the driving transistor, the selection transistor, and the reset transistor with each other.

The row driver 12 may drive the pixel array 11 by row unit. For example, the row driver may generate a transfer control signal for controlling the transfer transistor of the pixel circuit, a reset control signal for controlling the reset transistor, a selection control signal for controlling the selection transistor, and the like.

The readout circuit 15 may include a correlated double sampler (CDS), an analog-to-digital converter (ADC), and the like. The correlated double sampler may be connected through the pixels PX and column lines included in a row line, selected by a row selection signal provided by the row driver 12, and may detect the reset voltage and the pixel voltage by performing a correlated double sampling. The analog-to-digital converter may convert the reset voltage and the pixel voltage detected by the correlated double sampler into a digital signal and output the digital signal.

The bias circuit 14 may, while the readout circuit 15 detects the reset voltage and the pixel voltage from the pixels PX, input a certain level of bias current to the column lines connected to the pixels PX. The bias circuit 14 may include a plurality of current circuits corresponding to the column lines. The switching circuit 13 may set a connection path of the plurality of the current circuits and the column lines.

Operations of the row driver 12, the switching circuit 13, the bias circuit 14, and the readout circuit 15 may be determined by the timing controller 16, and the timing controller 16 may operate in response to a control command transmitted from the image processor 20. The image processor 20 may process image data output from the readout circuit 15 into a signal, and output the signal to a display device or store the signal in a storage device such as a memory, and the like. Alternately, in the case in which the image processing device 1 is mounted in a self-driving vehicle, the image processor 20 may process the image data into a signal and transmit the signal to a main controller controlling the self-driving vehicle, or to other components.

Figure 2:
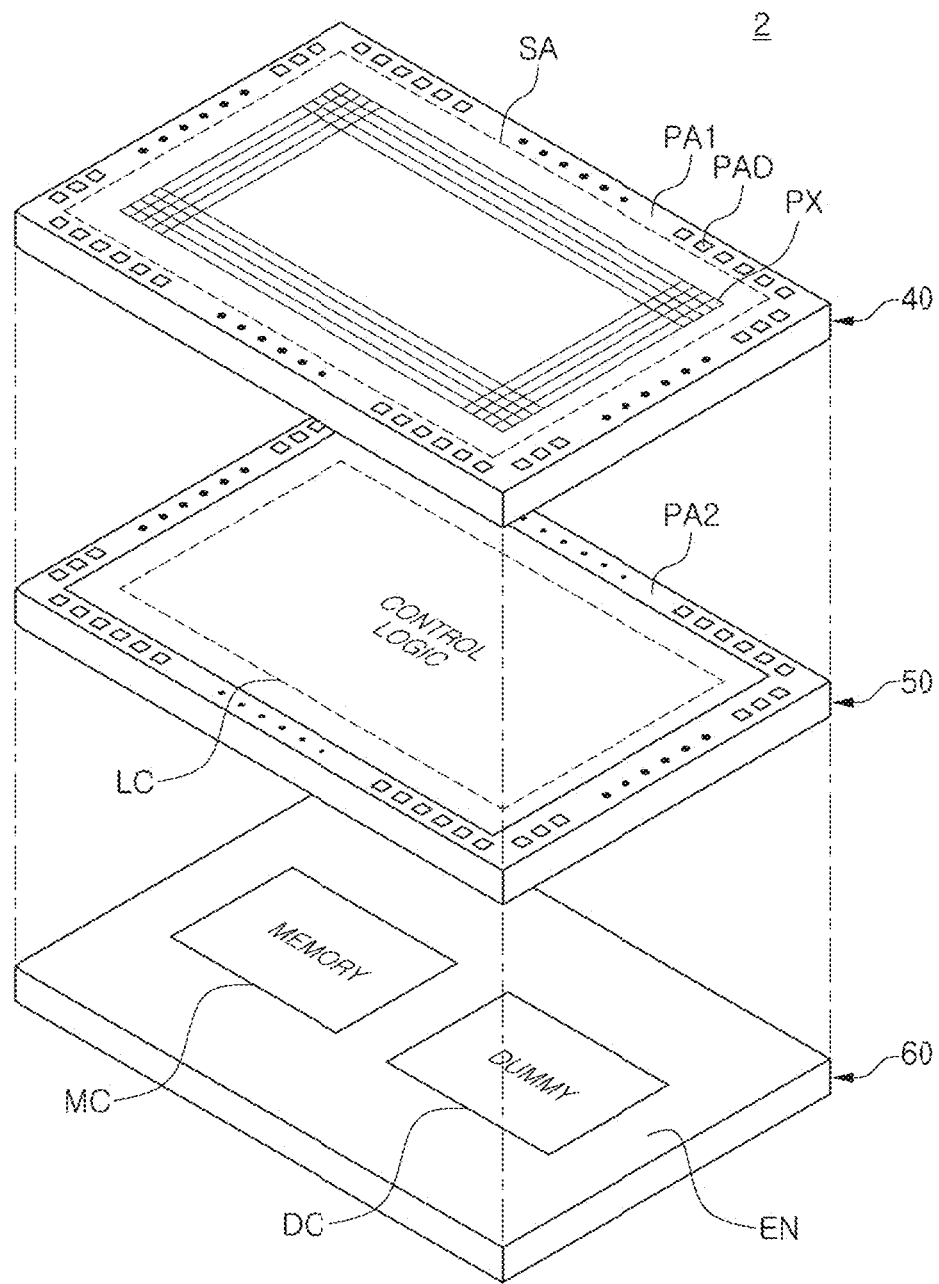
FIGS. 2 and 3 are schematic diagrams illustrating an image sensor according to an example embodiment in the present inventive concepts.
Figure 3:
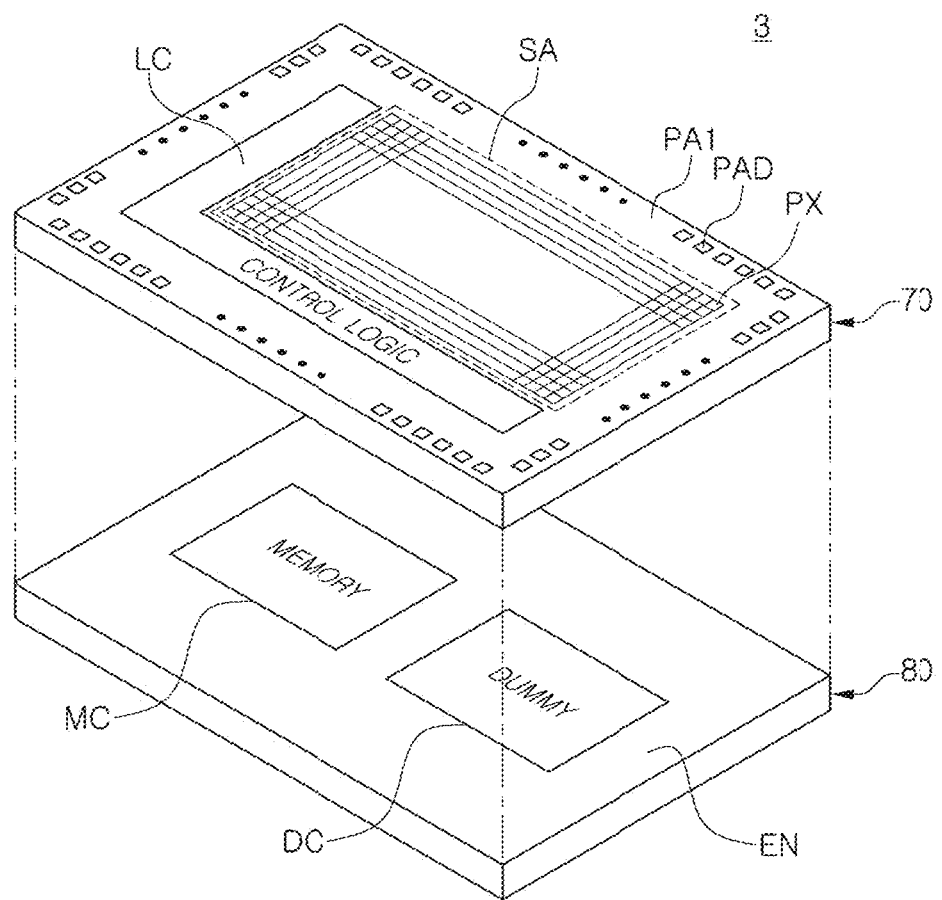

FIGS. 2 and 3 are schematic diagrams illustrating an image sensor according to an example embodiment.

Referring to FIG. 2, an image sensor 2 according to the example embodiment may include a first layer 40, a second layer 50 arranged in a lower portion of the first layer 40, a third layer 60 arranged in a lower portion of the second layer 50, and the like. The first layer 40, the second layer 50, and the third layer 60 may be layered in a perpendicular direction. In the example embodiment, the first layer 40 and the second layer 50 may be layered to each other in a wafer level, and the third layer 60 may be attached to a lower portion of the second layer 50 in a chip level. The first to third layers 40, 50, and 60 may be provided in a single semiconductor package.

The first layer 40 may include a sensing area SA in which a plurality of pixels PX are arranged, and a first pad area PA1 arranged around the sensing area SA. A plurality of upper pads PAD may be included in the first pad area PA1, and the plurality of upper pads PAD may be connected to pads and a control logic (LC) arranged in a second pad area PA2 of the second layer 50 through a via VIA, or the like.

Each of the plurality of pixels PX may include a photo diode receiving light and generating an electric charge, a pixel circuit processing the electric change generated in the photo diode, and the like. The pixel circuit may include a plurality of transistors for outputting a voltage corresponding to the electric change generated by the photo diode.

The second layer 50 may include a plurality of devices providing the control logic LC. The plurality of devices included in the control logic LC may provide circuits for driving a pixel circuit arranged in the first layer 40, that is, for example, a row driver, a column driver, a timing controller, and the like. The plurality of devices included in the control logic LC may be connected to the pixel circuit through the first and second pad areas PA1 and PA2. The control logic LC may obtain a reset voltage and a pixel voltage from the plurality of pixels PX and generate a pixel signal.

In an example embodiment, at least one of the plurality of pixels PX may include a plurality of photo diodes arranged on the same level. The pixel signals generated from each of electric changes of the plurality of photo diodes may have a phase difference, and the control logic LC may provide an auto focusing function on the basis of the phase difference of the pixel signals generated from the plurality of photo diodes included in one pixel PX.

The third layer 60 arranged in a lower portion of the second layer 50 may include a memory chip MC, a dummy chip DC, and a protective layer EN sealing the memory chip MC and the dummy chip DC. The memory chip MC may be a dynamic random access memory (DRAM) or a static random access memory (SRAM), and the dummy chip DC may not have a function of storing data substantially. The memory chip MC may be electrically connected to at least some of the devices included the control logic LC of the second layer 50 by means of a bump, and may store information required to provide the auto focusing function. In an example embodiment, the bump may be a micro bump.

Referring to FIG. 3, an image sensor 3 according to an example embodiment may include a first layer 70 and a second layer 80. The first layer 70 may include a sensing area SA in which a plurality of pixels PX are arranged, a control logic area LC in which devices for driving a plurality of pixels PX, and a first pad area PA1 arranged around the sensing area SA and the control logic area LC. A plurality of upper pads PAD may be included in the first pad area PA1, and the plurality of upper pads PAD may be connected to a memory chip MC arranged in the second layer 80 through a via VIA. The second layer 80 may include the memory chip MC, a dummy chip DC, and a protective layer EN sealing the memory chip MC and the dummy chip DC.

Figure 4:
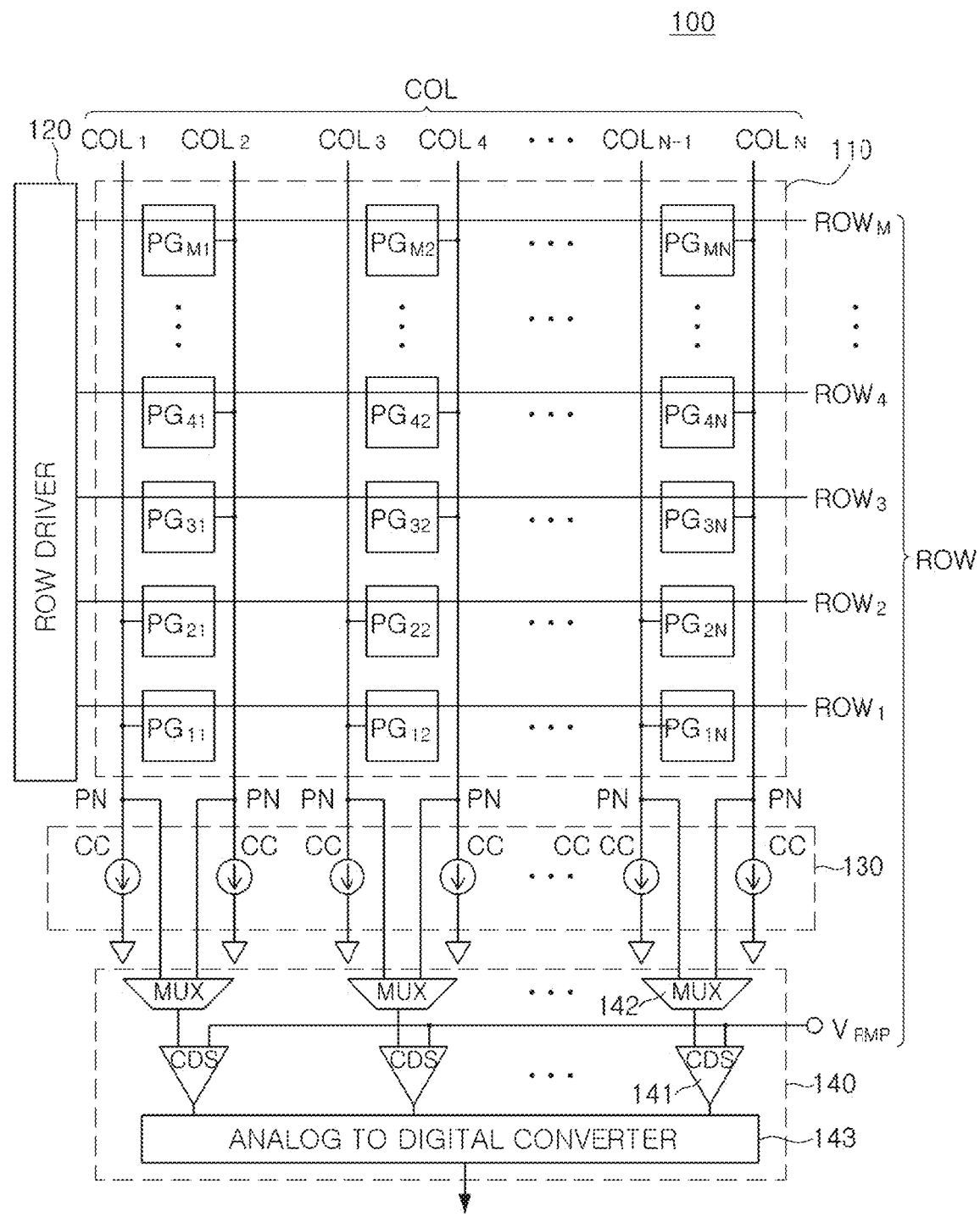
FIG. 4 is a diagram illustrating operations of an image sensor according to an example embodiment in the present inventive concepts.

FIG. 4 is a diagram illustrating operations of an image sensor according to an example embodiment.

Referring to FIG. 4, an image sensor 100 according to an example embodiment may include a pixel array 110, a row driver 120, a bias circuit 130, and a readout circuit 140, and the like. The row driver 120 may input a transfer control signal, a reset control signal, a selection control signal, and the like, to each of the pixel circuits through row lines ROW, ROW1 to ROWm. The readout circuit 140 may detect a pixel voltage and a reset voltage from pixels connected to the row line ROW selected by the row driver 120. The readout circuit 130 may include a sampling circuit 141 including a correlated double sampler CDS, a selection circuit 142 including a multiplexer MUX connecting at least one of column lines COL, COL1 to COLN, to an input terminal of the correlated double sampler CDS, and an analog-to-digital converter ADC converting an output from the correlated double sampler CDS into digital data, and the like.

The pixel array 110 may include the plurality of row lines ROW extended in one direction, and the column lines COL intersecting the row lines ROW. The row lines ROW and the column lines COL may be connected to a plurality of pixel groups PG11 to PGMN. Each of the plurality of pixel groups PG11 to PGMN may include two or more pixels, and each of the pixels may include a photo diode and a pixel circuit. In the example embodiment, the pixels included in each of the plurality of pixel groups PG11 to PGMN may share at least some of a plurality of transistors included in the pixel circuit. For example, each of the plurality of pixel groups PG11 to PGMN may include at least one photo diode responding to red light, green light, and blue light and generating an electric charge.

The bias circuit 130 may include a plurality of current circuits CC. The plurality of current circuits CC may input a bias current to the column lines COL connected to the pixels during a readout operation in which the correlated double sampler CDS obtains the reset voltage and the pixel voltage from the pixels. An input terminal of the correlated double sampler CDS may be connected to one of the column lines, and the multiplexer MUX may select one of two or more column lines and connect the column line to the input terminal. In the example embodiment in FIG. 4, the column lines COL adjacent to each other may share one correlated double sampler CDS through the multiplexer MUX.

Meanwhile, depending on an operational mode of the image sensor 100, the bias current input to the column lines COL by each of the plurality of current circuits CC may be the same or different. Also, each of the plurality of current circuits CC may include a plurality of transistors, and each of the plurality of current circuits CC may occupy substantially the same size of circuit area. In other words, each of the plurality of current circuits CC may be implemented using the transistors having the same size.

In the example embodiment, the multiplexer MUX may select odd-numbered column lines COL1, COL3, . . . COLN−1 and connect the column lines to the input terminal of the correlated double sampler CDS during a first time period. During the first time period, even-numbered column lines COL2, COL4, . . . COLN may be separated from the correlated double sampler CDS. The bias current output by the current circuits CC connected to the odd-numbered column lines COL1, COL3, . . . COLN−1 during the first time period may be higher than the bias current output by the current circuits CC connected to the even-numbered column lines COL2, COL4, . . . COLN. The first time period may be the time required to perform a readout operation to the pixels connected to the odd-numbered column lines COL1, COL3, . . . COLN−1. For example, the first time period may be an integer multiple of a horizontal period time of the image sensor 100. As an example, the first time may be determined by multiplying the number of pixels included in each of the plurality of pixel groups PG11-PGMN by the horizontal period time.

When a second time period arrives after the first time period, the multiplexer MUX may connect the even-numbered column lines COL2, COL4, . . . COLN to an input terminal of the correlated double sampler CDS. The bias current output by the current circuits CC connected to the odd-numbered column lines COL1, COL3, . . . COLN−1 during the second time period may be lower than the bias current output by the current circuits CC connected to the even-numbered column lines COL2, COL4, . . . COLN.

In other words, as the column lines COL connected to the input terminal of the correlated double sampler CDS in the first time period are different from the column lines COL connected to the input terminal of the correlated double sampler CDS in the second time period, the odd-numbered column lines COL1, COL3, . . . COLN−1 and the even-numbered column lines COL2, COL4, . . . COLN may be connected to different circuits among the current circuits CC in the first time period and the second time period. For example, during the first time period, the odd-numbered column lines COL1, COL3, . . . COLN−1 may be connected to the current circuits CC outputting a relatively high bias current, and the even-numbered column lines COL2, COL4, . . . COLN may be connected to the current circuits CC outputting a relatively low bias current. Similarly, during the second time period, the odd-numbered column lines COL1, COL3, . . . COLN−1 may be connected to the current circuits CC outputting a relatively low bias current, and the even-numbered column lines COL2, COL4, . . . COLN may be connected to the current circuits CC outputting a relatively high bias current As described above, when a level of the bias current input to the column lines COL changes, a drain-source voltage VDS of the transistor included in at least one of the current circuits CC may be reduced to a value close to OV. When the transistor of which the drain-source voltage VDS is reduced to OV is turned on, a relatively long settling time may be required to increase the drain-source voltage. Thus, a relatively high noise component may be included in the reset voltage and the pixel voltage obtained early in the first time period or the second time period, which may lead to a fixed pattern noise.

In contrast, in one or more example embodiments, to resolve the above issue, the transistors of the current circuits CC outputting the bias current to the column lines COL may maintain a turn-on state while a readout operation is performed on the pixels. Accordingly, noise components which may occur by turning the transistor on and turning off may be significantly reduced, and a settling time required to stabilize the voltages of the column lines COL may also be reduced, thereby improving a performance of the image sensor 100.

Figure 5:
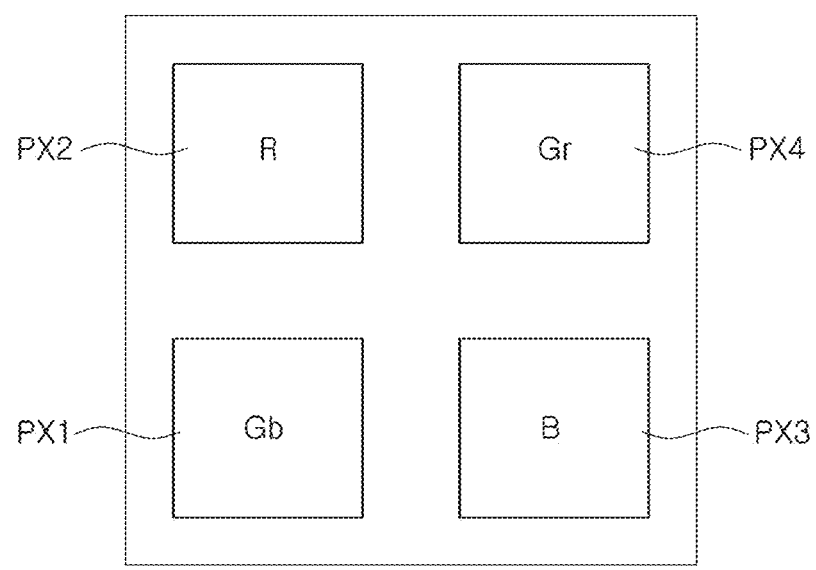
FIGS. 5 and 6 are diagrams illustrating a pixel group included in a pixel array of an image sensor according to an example embodiment in the present inventive concepts.
Figure 6:
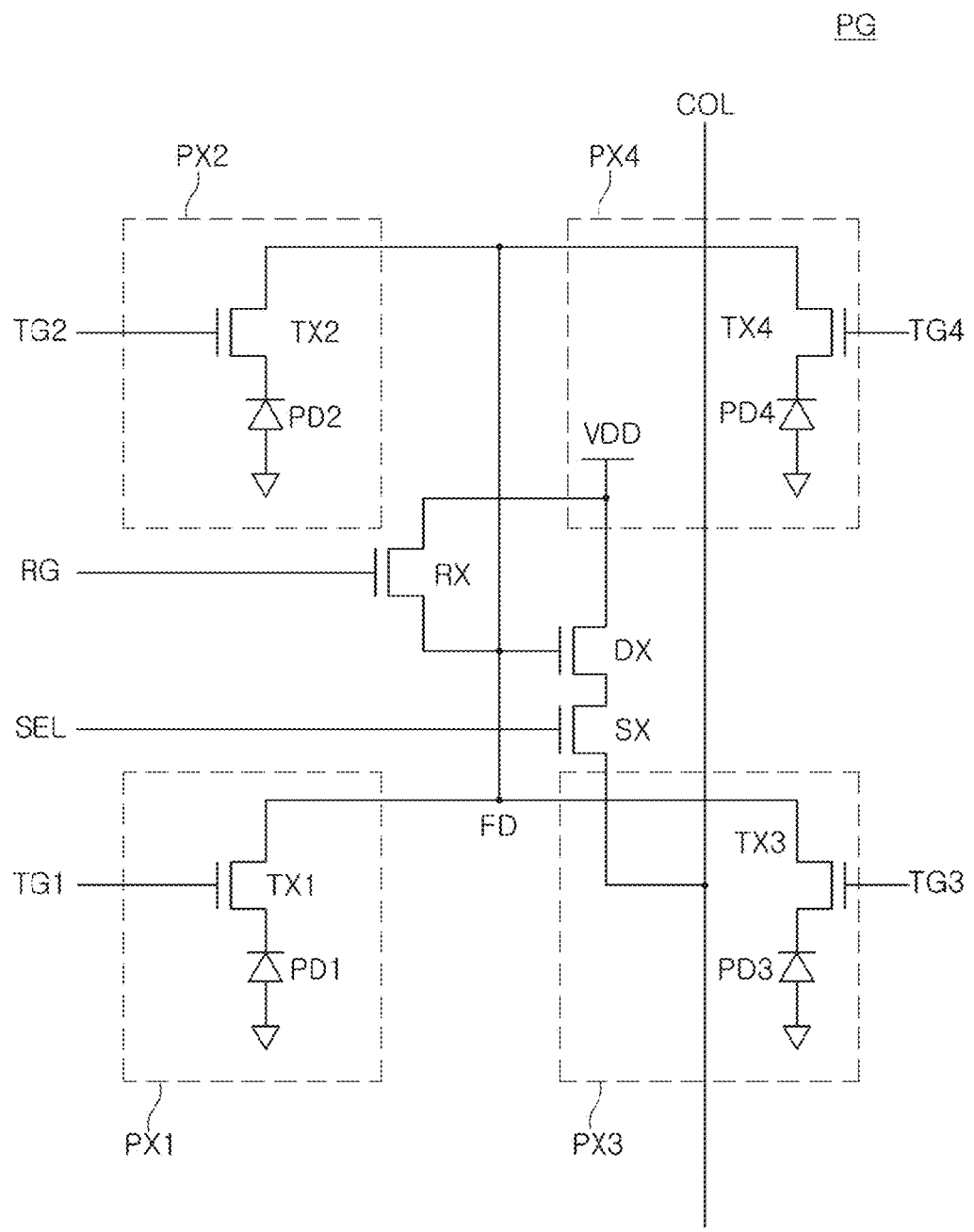

FIGS. 5 and 6 are diagrams illustrating a pixel group included in a pixel array of an image sensor according to an example embodiment.

Referring to FIGS. 5 and 6, a pixel group PG of an image sensor according to an example embodiment may include a plurality of pixels arranged in a square. In the example embodiment in FIGS. 5 and 6, the pixel group PG may include first to fourth pixels PX1 to PX4 arranged in a 2×2 matrix form. For example, the first pixel PX1 and the fourth pixel PX4 may include a first photo diode PD1 and a fourth photo diode PD4 responding to green light and generating an electric charge, respectively. The second pixel PX2 may include a second photo diode PD2 responding to red light and generating an electric change, and the third pixel PX3 may include a third photo diode PD3 responding to blue light and generating an electric charge. However, an example embodiment thereof is not limited thereto, and the number and an arrangement of pixels included in the pixel group PG and the color of light to which the photo diode of each of the pixels responds, and the like, may modified in various manners in other example embodiments.

Referring to the circuit diagram in FIG. 6, the first to fourth pixels PX1 to PX4 may include first to fourth transfer transistors TX1 to TX4 for moving the electric charge generated in the first to fourth photo diodes PD1 to PD4 to a floating diffusion node FD, in addition to the first to the fourth photo diodes PD1 to PD4.

The first to fourth pixels PX1 to PX4 may share the floating diffusion FD, a driving transistor DX, a reset transistor RX, and a selection transistor SX, except for the first to fourth photo diodes PD1 to PD4 and the first to fourth transfer transistors TX1 to TX4.

The first to fourth transfer transistors TX1 to TX4 included in the pixel group PG may be turned on one by one in a desired (or, alternatively, a predetermined) order. For example, when the floating diffusion FD is reset, and the selection transistor SX is turned on by turning on the reset transistor RX, a readout circuit may detect a reset voltage through the column line COL. Thereafter, when the first transfer transistor TX1 is turned on, and the electric charge generated in the first photo diode PD1 is moved to the floating diffusion FD, the readout circuit may obtain a pixel voltage of the first pixel PX1 through the column line COL.

After the pixel voltage of the first pixel PX1 is obtained, the floating diffusion FD may be reset again, and the readout circuit may obtain a reset voltage through the column line COL. Thereafter, when the second transfer transistor TX2 is turned on, and the electric charge generated in the second photo diode PD2 is accumulated in the floating diffusion FD, the readout circuit may obtain a pixel voltage of the second pixel PX2 through the column line COL. In other words, the readout circuit may sequentially obtain the reset voltage and the pixel voltage in the first to fourth pixels PX1 to PX4 included in one pixel group PG. The order of detecting the reset voltage and the pixel voltage in the first to fourth pixels PX1 to PX4 may be modified in various manners.

FIGS. 7 to 12 are diagrams illustrating operations of an image sensor according to an example embodiment.

Figure 7:
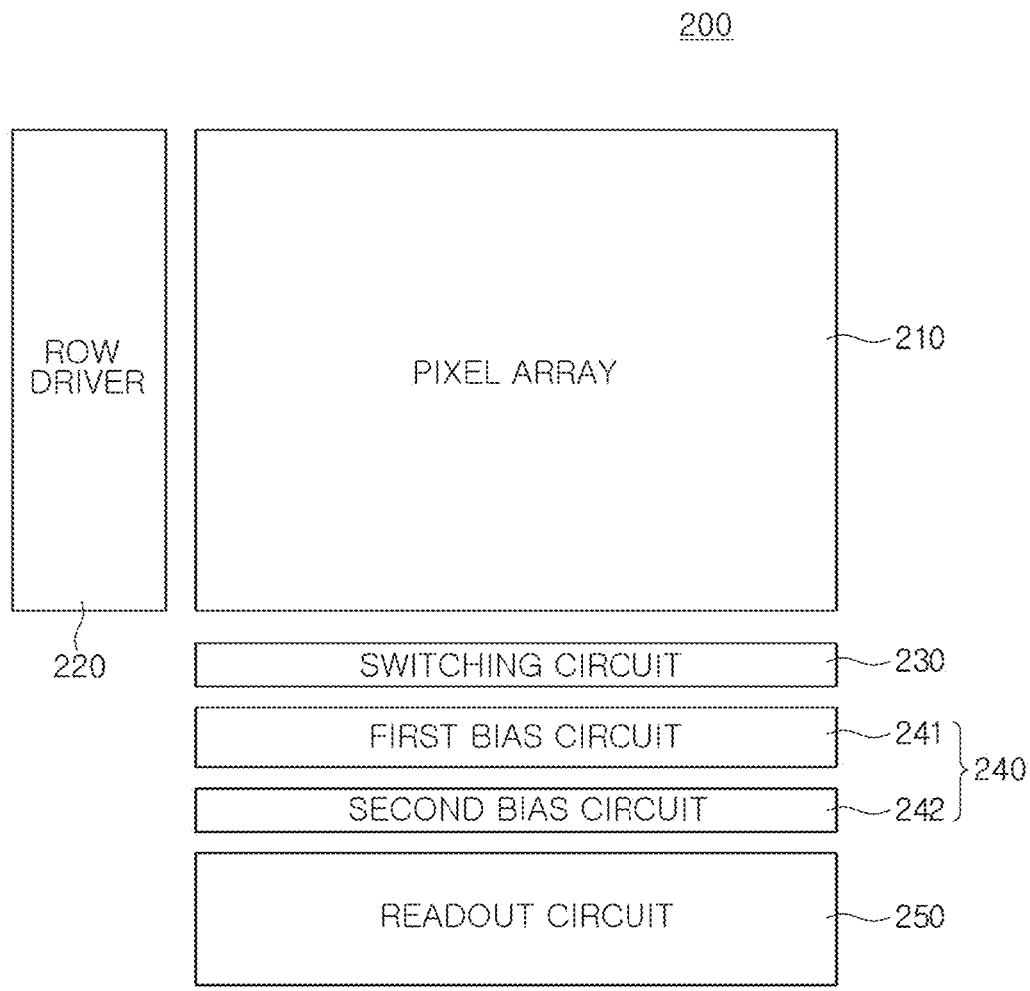
FIGS. 7 to 9 are diagrams illustrating operations of an image sensor according to an example embodiment in the present inventive concepts.
Figure 8:
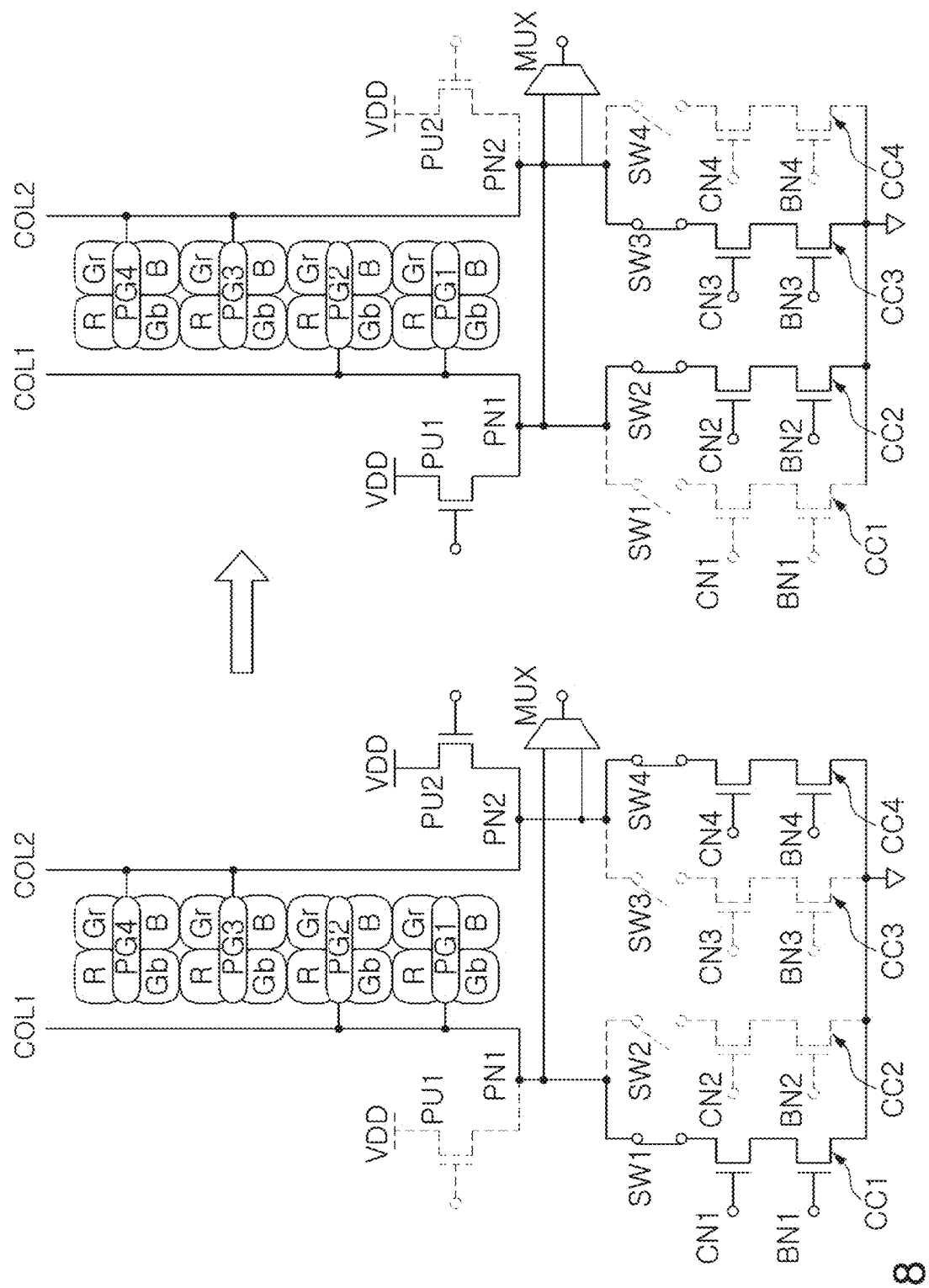
Figure 9:
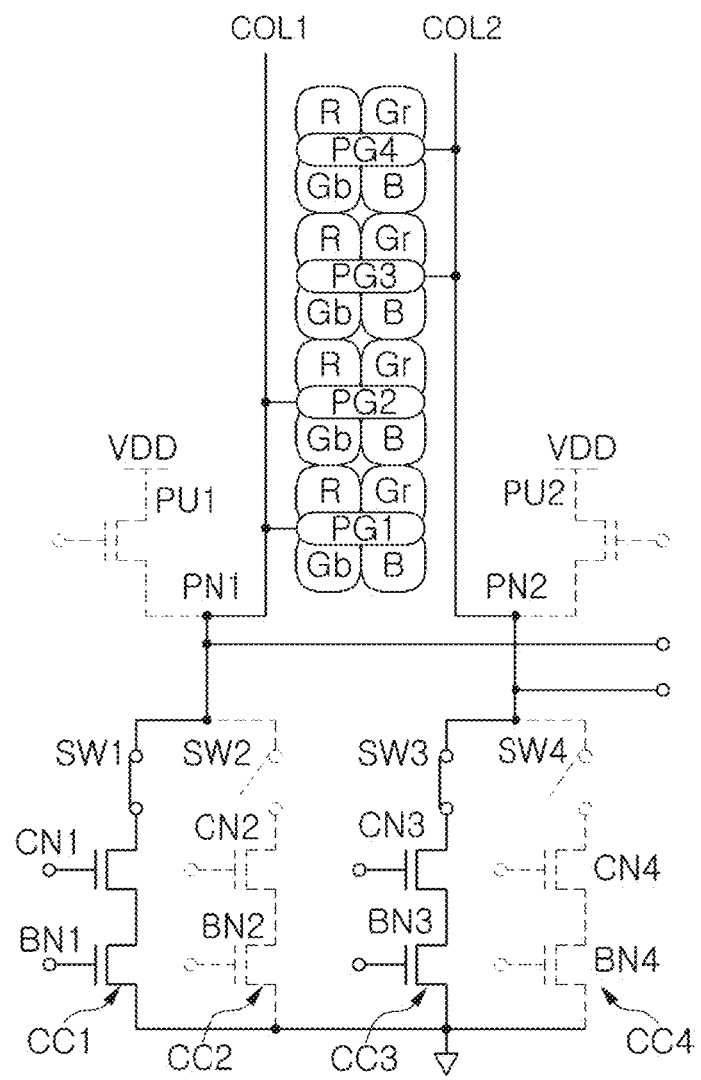

FIGS. 7 to 9 are diagrams illustrating operations of a general image sensor according to an example embodiment.

Referring to FIG. 7, an image sensor 200 may include a pixel array 210, a row driver 220, a switching circuit 230, a bias circuit 240, and a readout circuit 250, and the like. The bias circuit 240 may include a first bias circuit 241 outputting a first bias current and a second bias circuit 242 outputting a second bias current. The switching circuit 230 may connect each of a plurality of column lines connected to a plurality of pixels to the first bias circuit 241 or the second bias circuit 242.

FIGS. 8 and 9 are diagrams illustrating operations of a switching circuit 230 and a bias circuit 240. Referring to FIGS. 8 and 9, the switching circuit 230 may include first to fourth switches SW1 to SW4, and the bias circuit 240 may include first to fourth current circuits CC1 to CC4. Between the first to fourth switches SW1 to SW4 and the column lines COL1 and COL2, first and second pixel nodes PN1 and PN2 may be defined. Each of the first to fourth current circuits CC1 to CC4 may include cascode transistors CN1 to CN4 and bias transistors BN1 to BN4.

The first and third current circuits CC1 and CC3 may be configured to output the relatively high first bias current, and the second and fourth current circuits CC2 and CC4 may be configured to output the relatively low second bias current. In other words, in the image sensor in FIGS. 8 and 9, each of the first to fourth current circuits CC1 to CC4 may be connected to only one of the column lines COL1 and COL2.

Referring to FIG. 8, a reading-out operation may be performed on first and second pixel groups PG1 and PG2 connected to the first column line COL1 during a first time period, and during a second time period, a reading-out operation may be performed on third and fourth pixel groups PG3 and PG4 connected to the second column line COL2. During the first time period, the first switch SW1 and the fourth switch SW4 may be turned on, and the first column line COL1 may receive an input of the first bias current from the first current circuit CC1. Meanwhile, the second column line COL2 may receive an input of the second bias current from the fourth current circuit CC2. A drain-source voltage VDS of the transistors CN2, CN3, BN2 and BN3 included in the second and third current circuits CC2 and CC3 may be reduced to a value close to 0V.

During the first time period, the multiplexer MUX may select the first column line COL1 receiving an input of the first bias current and connect the column line COL1 to an input terminal of a correlated double sampler. When the second time period arrives after the first time period, a reading-out operation may be performed on the third and fourth pixel groups PG3 and PG4 connected to the second column line COL2. During the second time period, the second switch SW2 and the third switch SW3 may be turned on, and the first column line COL1 may receive an input of the bias current from the second current circuit CC2, and the second column line COL2 from the third current circuit CC3. Thus, the second bias current may be input to the first column line COL1, and the first bias current may be input to the second column line COL2.

Entering the second time period from the first time period, the transistors CN3 and BN3 of the third current circuit CC3 may be converted to be in a turn-on state from a turn-off state. As the transistors CN3 and BN3 of the third current circuit CC3 maintain a turn-off state during the first time period, the drain-source voltage may be reduced to a value close to 0V. Accordingly, even after the second time period starts, a certain amount of settling time may be required until the first bias current is stabilized after the transistors CN3 and BN3 of the third current circuit CC3 are turned on. Consequently, a readout circuit may read out the reset voltage and the pixel voltage from some of the pixels of the third pixel group PG3 during the settling time of the first bias current, which may lead to an increase of noise components.

FIG. 9 is a diagram illustrating an operational mode in which a readout operation is simultaneously performed on two or more pixels. In the example embodiment in FIG. 9, the first switch SW1 and the third switch SW3 may be turned on, and the second switch SW2 and the fourth switch SW4 may be turned off. Accordingly, a first bias current may be input to both of a first column line COL1 and a second column line COL2.

In the example embodiment in FIG. 9, a readout operation may be simultaneously performed on two or more pixels included in each of a first pixel group PG1 and a second pixel group PG2. For example, a pixel voltage may be simultaneously detected from a pixel sensing red light in the first pixel group PG1 and a pixel sensing red light in the second pixel group PG2. The pixel voltage may correspond to a sum of electric charges generated in the pixels sensing red light in the first pixel group PG1 and the second pixel group PG2. Meanwhile, the first pixel node PN1 connected to the first column line COL1 and the second pixel node PN2 connected to the second column line COL2 may be connected to input terminals of different correlated double samplers CDS.

As described above, in the example embodiment in FIGS. 7 to 9, at least some of the transistors CN1 to CN4 and BN1 to BN4 included in the current circuits CC1 to CC4 may be converted from a turn-on state to a turn-off state or vice versa depending on an operation time. Particularly, the first and third current circuits CC1 and CC3 supplying a relatively high first bias current to the first and second column lines COL1 and COL2 may need a settling time until the first bias current is stabilized, which may lead to a degradation of an operating speed of an image sensor or a deterioration of noise properties.

In contrast, in one or more example embodiments, transistors converted to a turn-on state and a turn-off state in the current circuits while a readout operation is performed, regardless of an operational mode of an image sensor, may not be provided. Thus, a bias current may be stably input to the column line, and an operating speed of an image sensor and noise properties may be improved. The corresponding configuration will be described in greater detail with reference to FIGS. 10 to 12.

Figure 10:
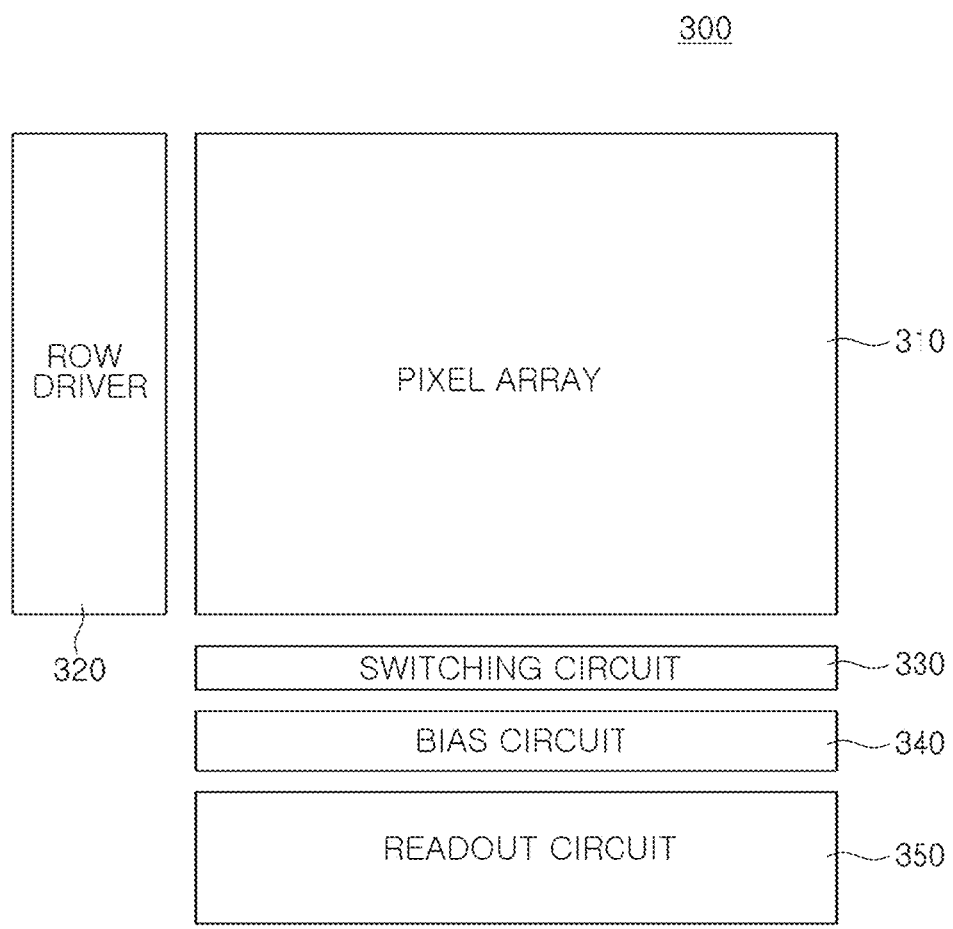
FIGS. 10 to 12 are diagrams illustrating operations of an image sensor according to an example embodiment in the present inventive concepts.

Referring to FIG. 10, an image sensor 300 according to an example embodiment may include a pixel array 310, a row driver 320, a switching circuit 330, a bias circuit 340, a readout circuit 350, and the like. The bias circuit 240 may have a smaller area than in the example embodiment in FIG. 7, due to the number of current circuits included in the bias circuit 340 being low. In other words, in the image sensor 300 according to the example embodiment, an area of the bias circuit 340 may be reduced, thereby improving integration density.

Figure 11:
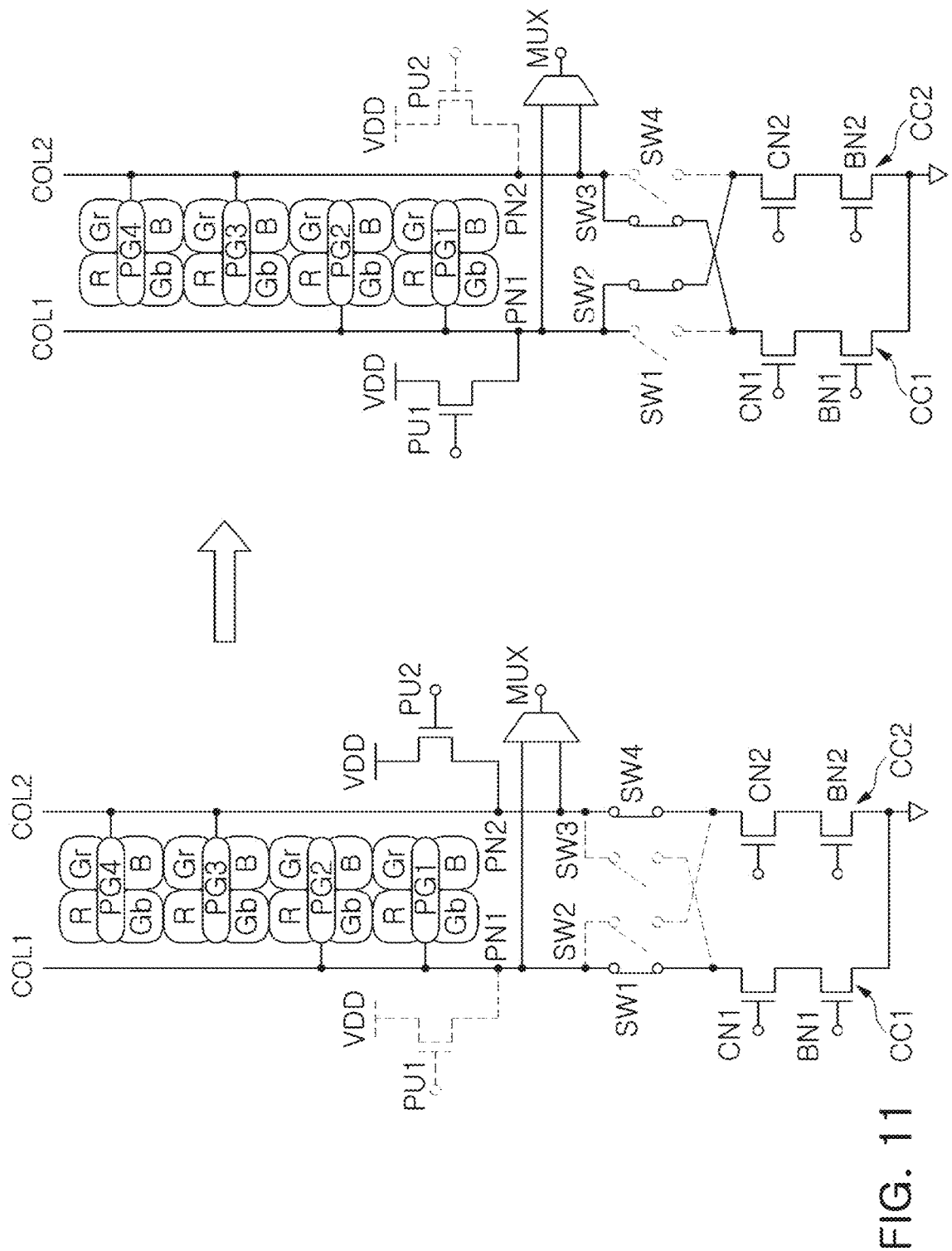

FIGS. 10 and 11 are diagrams illustrating operations of a switching circuit 330 and a bias circuit 340. Referring to FIGS. 10 and 11, each of a first column line COL1 and a second column line COL2 may be extended in a first direction, and may be connected to a plurality of pixel groups PG1 to PG4. Each of the plurality of pixel groups PG1 to PG4 may include a plurality of pixels, but differently from the example embodiment in FIGS. 10 and 11, the number of pixels included in each of the plurality of pixel groups PG1 to PG4 is not limited to four.

The switching circuit 330 may include first to fourth switches SW1 to SW4, and the bias circuit may include a first current circuit CC1 and a second current circuit CC2. Thus, compared to the example embodiment in FIG. 8, the number of the current circuits CC1 and CC2 may be reduced, and an area of the circuits may be reduced as well. Between the first to fourth switches SW1 to SW4 and the column lines COL1 and COL2, first and second pixel nodes PN1 and PN2 may be defined. Each of the first current circuit CC1 and the second current circuit CC2 may include cascode transistors CN1 and CN2 and bias transistors BN1 and BN2. A size and a current performance of the transistors CN1 and BN1 included in the first current circuit CC1 may be substantially the same as those of the transistors CN2 and BN2 included in the second current circuit CC2.

The first current circuit CC1 and the second current circuit CC2 may output a first bias current or a second bias current depending on a voltage input to a gate electrode of the cascode transistors CN1 and CN2 and the bias transistors BN1 and BN2. The first bias current may be configured to be higher than the second bias current.

Figure 12:
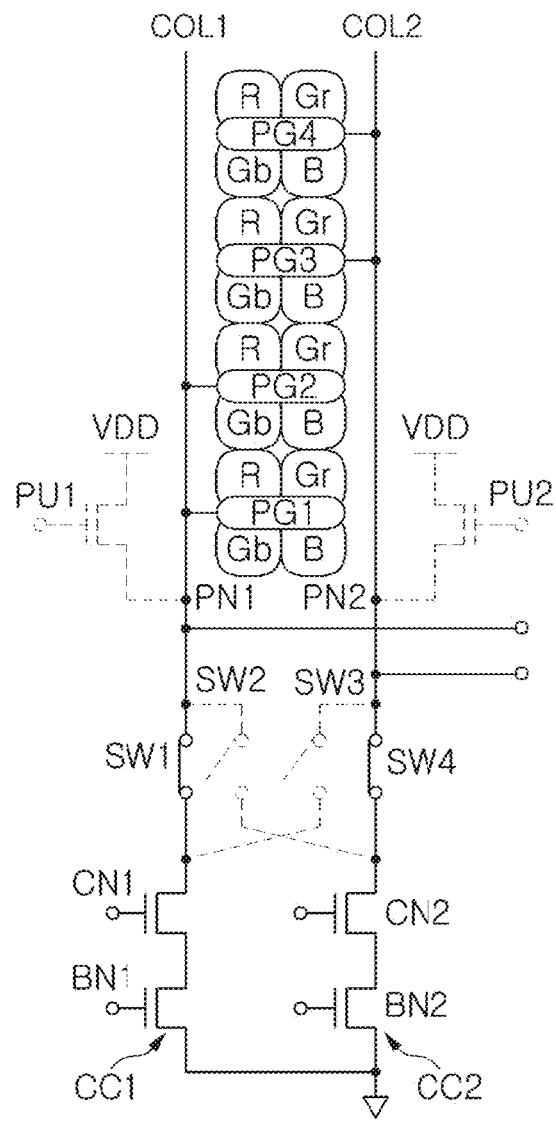

In the example embodiment, FIG. 11 illustrates a first operational mode, and FIG. 12 illustrates a second operational mode. In the first operational mode, only one of a first column line COL1 and a second column line COL2 may be connected to an input terminal of a correlated double sampler. In the second operational mode, the first column line COL1 and the second column line COL2 may be connected to input terminals of different correlated double samplers. In other words, in the second operational mode, a readout operation to pixels connected to the first column line COL1 and a readout operation to pixels connected to the second column line COL2 may be simultaneously performed. Also, in the second operational mode, a readout circuit may obtain a pixel voltage from some of the pixels simultaneously. The second operational mode may be a binning mode.

Referring to FIG. 11, in a first operational mode, during a first time period, a first switch SW1 and a fourth switch SW4 may be turned on, and a second switch SW2 and a third switch SW3 may be turned off. Thus, a first column line COL1 may be connected to a first current circuit CC1, and a second column line COL2 may be connected to a second current circuit CC2. The first current circuit CC1 may output a first bias current, and the second current circuit CC2 may output the second bias current. A multiplexer MUX may connect a first pixel node PN1 defined between the first column line COL1 and the switching circuit to an input terminal of a correlated double sampler. Accordingly, during the first time period, a readout operation may be performed on pixels connected to the first column line COL1.

When a second time period starts after the first time period in the first operational mode, the first switch SW1 and the fourth switch may be turned off, and the second switch SW2 and the third switch SW3 may be turned on. In the second time period, the first current circuit CC1 may output the first bias current, and the second current circuit CC2 may output the second bias current as in the first time period. Thus, during the second time period, the second bias current may be input to the first column line COL1, and the first bias current may be input to the second column line COL2. The multiplexer MUX may select the second pixel node PN2 and connect the second pixel node PN2 to an input terminal of the correlated double sampler CDS, and a readout operation may be performed on the pixels connected to the second column line COL2 during the second time period.

When a third time period arrives after the second time period, as in the first time period, the first switch SW1 and the fourth switch may be turned on, and a readout operation may be performed on other pixel groups connected to the first column line COL1. For example, the other pixel groups may be configured to be arranged in an upper portion of the fourth pixel group PG4 in a direction in which the column lines COL1 and COL2 are extended. In other words, in the example embodiment, the first current circuit outputting the first bias current may be alternately connected to the first column line COL1 and the second column line COL2 at desired (or, alternatively, predetermined) periods. In the example embodiment, the aforementioned period may refer to the time of an integer multiple of a horizontal period required to read out a reset voltage and a pixel voltage from one pixel.

In the example embodiment in FIG. 10, regardless of an operation of the multiplexer MUX to select the first column line COL1 or the second column line COL2, the first current circuit CC1 may output the first bias current, and the second current circuit CC2 may output the second bias current. Cascode transistors CN1 and CN2 and bias transistors BN1 and BN2 included in the first current circuit and the second current circuit CC2 may not be turned off, and when entering the second time period from the first time period, the first bias current may be swiftly input to the second column line COL2. Thus, noise properties may be improved in relation to the pixels to which a readout operation is performed through the second column line COL2 early in the second time period. Also, the first bias current may be supplied by the first current circuit CC1 in which the transistors CN1 and BN1 maintain a turn-on state regardless of the time periods, the first time period or the second time period, and thus, a speed of the readout operation may be improved.

Meanwhile, a first full-up transistor PU1 and a second full-up transistor PU2 may be connected to the first pixel node PN1 and the second pixel node PN2, respectively. The second full-up transistor PU2 may be turned on during the first time period, and may maintain a voltage of the second pixel node PN2 at a value close to a power voltage VDD to allow the correlated double sampler to swiftly obtain the pixel voltage when entering the second time period from the first time period. The first full-up transistor PU1 may be being turned-on during the second time period, and when the first pixel node PN1 is connected to the correlated double sampler after the second time period elapses, the first full-up transistor PU1 may maintain a voltage of the first pixel node PN1 at the power voltage VDD to allow the correlated double sampler CDS to swiftly obtain the pixel voltage.

Differently from the descriptions described with reference to FIGS. 7 to 9 above, in the example embodiment in FIG. 10, the first current circuit CC1 and the second current circuit CC2 may continuously output the first bias voltage and the second bias voltage, respectively. Also, the first column line COL1 or the second column line COL2, objects of the readout operation, may receive the first bias current through only the first current circuit CC1. Consequently, as the time period in which the first current circuit CC1 supplying the first bias current is turned off, required for the readout operation, may not be present, a trap phenomenon occurring when the transistor is turned on in a turn-off state may be prevented. By stably inputting the first bias current to the first column line COL1 or the second column line COL2, noise properties may be improved along with a speed of a readout operation.

FIG. 12 is a circuit diagram illustrating a second operational mode in which a first pixel node PN1 and a second pixel node PN2 are connected to input terminals of different correlated double samplers CDS and perform a readout operation. As an example, the second operational mode may be a binning mode. In the example embodiment in FIG. 12, a first switch SW1 and a fourth switch SW4 may be turned on, and a second switch SW2 and a third switch SW3 may be turned off. Also, both of a first current circuit CC1 and a second current circuit CC2 may output a first bias current. Accordingly, the bias current may be input to both of a first column line COL1 and a second column line COL2.

In the second operational mode, each of the first column line COL1 and the second column line COL2 may be connected to at least two or more of pixels. For example, the first column line COL1 may be simultaneously connected to first pixels Gr of the first pixel group PG1 and the second pixel group PG2. Also, while the first column line COL1 is connected to the first pixels Gr of the first pixel group PG1 and the second pixel group PG2, the second column line COL2 may be connected to first pixels Gr of a third pixel group PG3 and a fourth pixel group PG4. In other words, in the second operational mode, the first column line COL1 and the second column line COL2 may be connected to different correlated double samplers, and each of the first column line COL1 or the second column line COL2 may be connected to two or more pixels.

Thus, in the second operational mode, an operating speed of an image sensor may be higher than an operating speed of the image sensor in a first operational mode. In the example embodiment, a readout operation is performed on first to fourth pixel groups PG1-PG4 and completed throughout 16 horizontal period times, whereas in the second operational mode, a readout operation is performed on first to fourth pixel groups PG1-PG4 and completed throughout horizontal period times. However, as some of pixels are connected to the first column line COL1 or the second column line COL2, and the readout operation is simultaneously performed to the pixels, a resolution of image data generated by the image sensor may degrade in the second operational mode.

As the second current circuit CC2 may need to output the first current in the second operational mode, transistors CN2 and BN2 included in the second current circuit CC2 may have a similar size to sizes of transistors CN1 and BN1 included in the first current circuit CC1. However, as compared to the example embodiment in FIGS. 8 and 9, the number of current circuits CC1 and CC2 included in a bias circuit may be decreased as compared to the example embodiment in FIGS. 8 and 9, an overall circuit area occupied by the bias circuit may be reduced.

Figure 13:
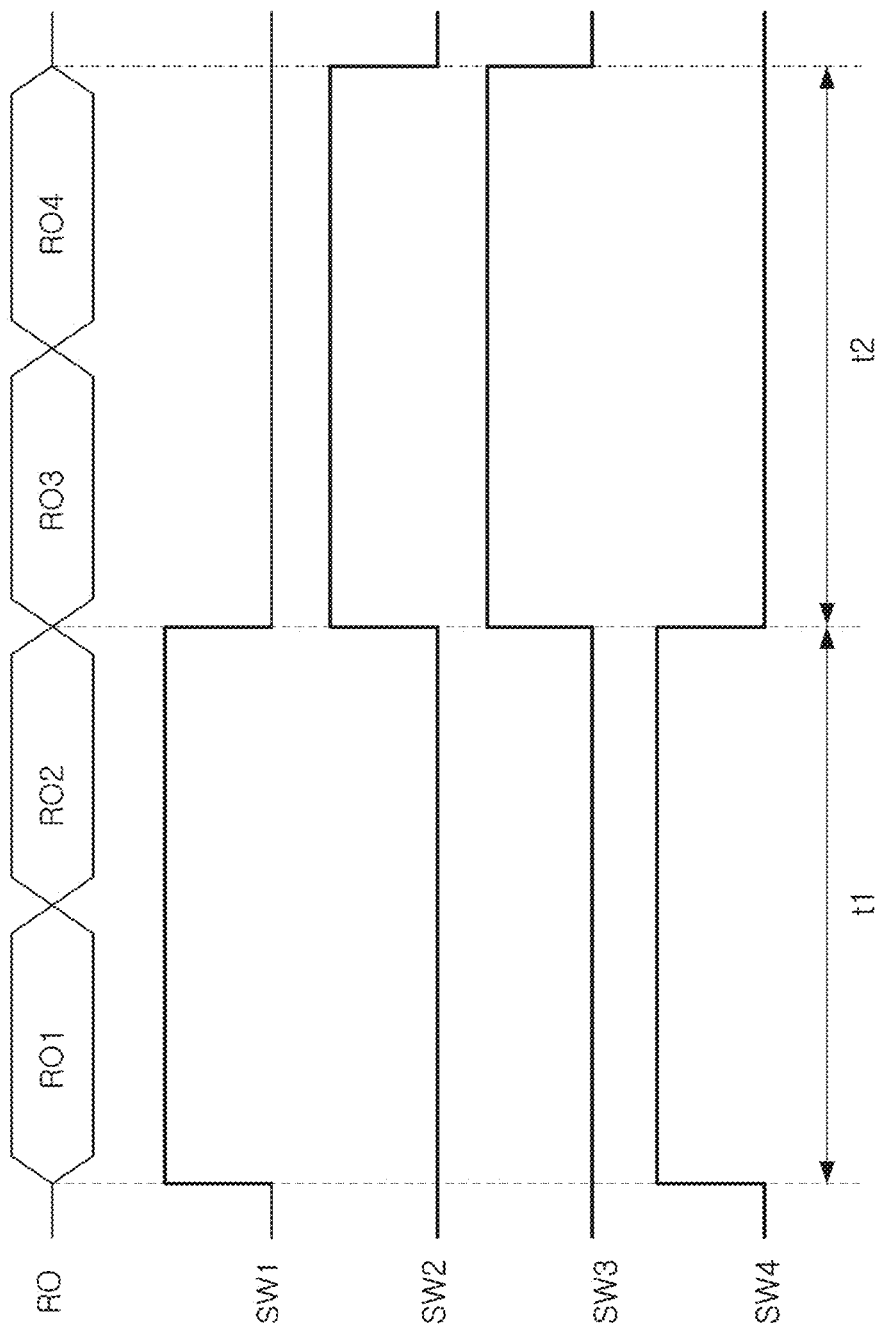
FIG. 13 is a timing diagram illustrating a readout operation of an image sensor according to an example embodiment in the present inventive concepts.

FIG. 13 is a timing diagram illustrating a readout operation of an image sensor according to an example embodiment. The example embodiment will be described with reference to FIG. 13, along with FIG. 11 as well, for ease of description.

FIG. 13 is a timing diagram illustrating an operation timing of first to fourth switches SW1 to SW4 when an image sensor operates in a first operational mode. Referring to FIG. 13, during a first time period t1, both of the first switch SW1 and the fourth switch SW4 may be turned on, and the second switch SW2 and the third switch SW3 may be turned off. During the first time period t1, a first readout operation RO1 may be performed to pixels of a first pixel group PG1, and a second readout operation RO2 may be performed on pixels of a second pixel group PG2.

When entering a second time period t2 from the first time period t1, both of the first switch SW1 and the fourth switch SW4 may be turned off, and the second switch SW2 and the third switch SW3 may be turned on. During the second time period t2, a third readout operation may be performed on pixels of a third pixel group PG3 and a fourth readout operation RO4 may be performed on pixels of a fourth pixel group PG4.

Figure 14:
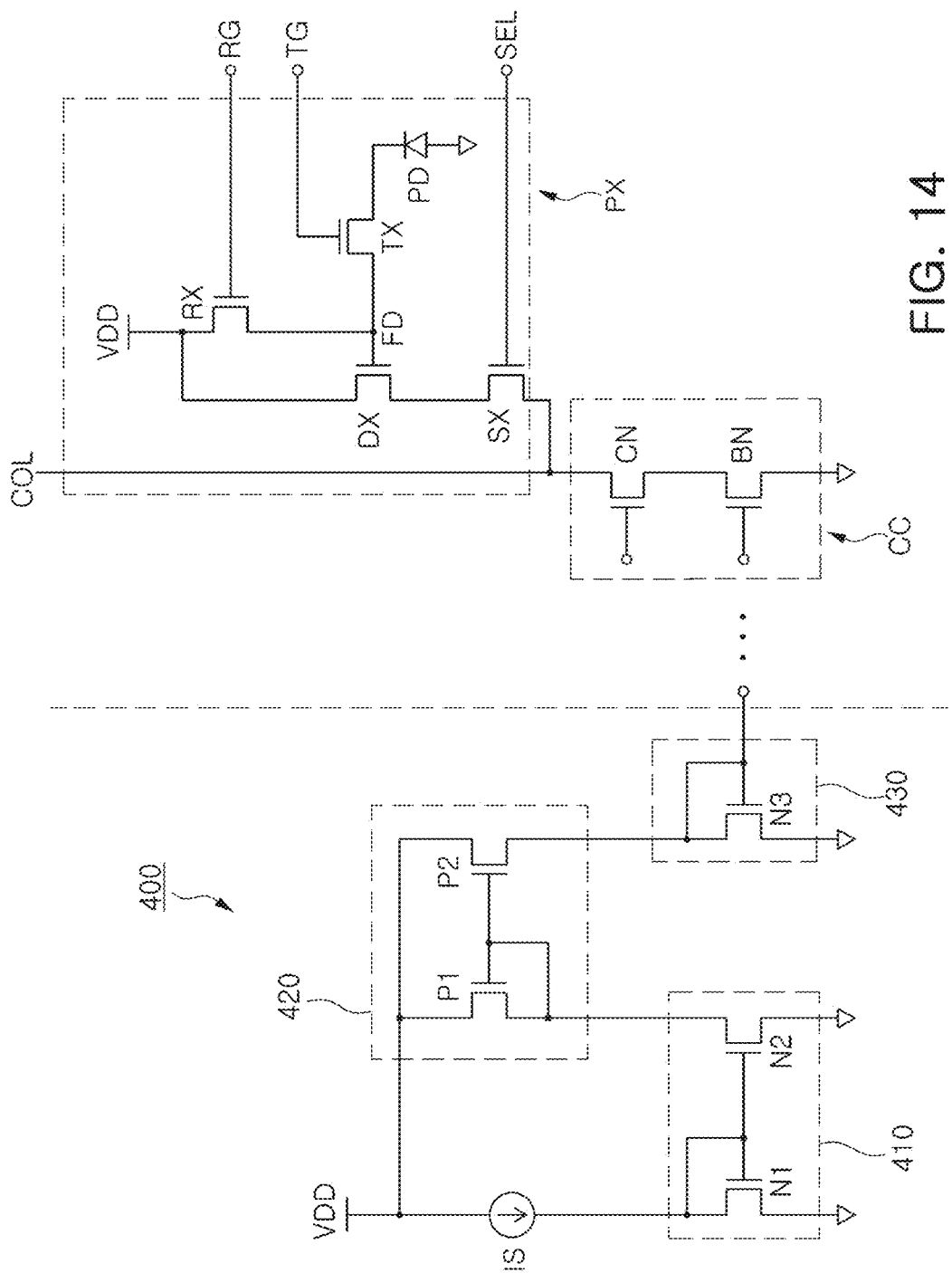
FIG. 14 is a circuit diagram illustrating a bias circuit of an image sensor according to an example embodiment in the present inventive concepts.

FIG. 14 is a circuit diagram illustrating a bias circuit of an image sensor according to an example embodiment.

Referring to FIG. 14, the bias circuit may include a current circuit CC for supplying a bias current IB to a column line COL and a current mirror circuit 400 for controlling the current circuit CC. The current mirror circuit 400 may include a first mirror circuit 410, a second mirror circuit 420, an output circuit 430, and the like, and other various types of circuits may be employed in addition to the circuits in the example embodiment in FIG. 14.

In the example embodiment in FIG. 14, a current supplied by a current source IS may be mirrored by a first mirror circuit 410, a second mirror circuit 420, and an output circuit 430, and may flow into the current circuit CC. A bias current IB output by the current circuit CC to the column line COL may be determined by a current mirror circuit 400.

An image sensor according to the example embodiment may include a plurality of current mirror circuits 400 as described with reference to FIG. 14. For example, the image sensor in the example embodiment may include the first current mirror and the second mirror circuit, and the first current mirror and the second mirror circuit may output the same level of bias current or different levels of bias current. The current circuit CC connected to the first current mirror circuit and the current circuit CC connected to the second current mirror circuit may have a similar size, a similar current performance, and the like, to each other. Thus, in the example embodiment, some of the current circuits CC having a similar size and a similar current performance may be connected to different current mirror circuits.

Figure 15:
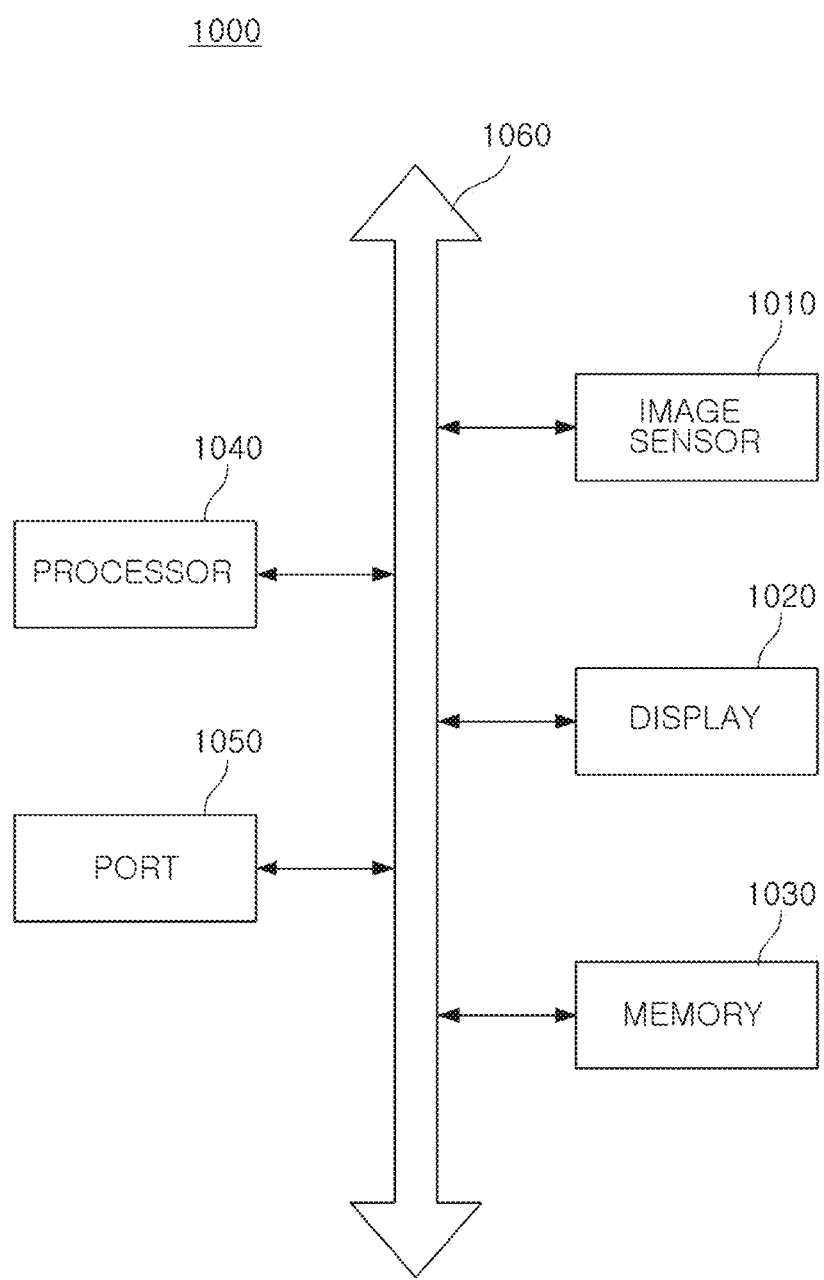
FIG. 15 is a block diagram illustrating an electronic device including an image sensor according to an example embodiment in the present inventive concepts.

FIG. 15 is a block diagram illustrating an electronic device including an image sensor.

A computer device 1000 in the example embodiment in FIG. 15 may include an image sensor 1010, a display 1020, a memory 1030, a processor 1040, a port 1050, and the like. The computer device 1000 may further include a wired/wireless communication device, a power device, and the like. The port 1050 among the components illustrated in FIG. 15 may be provided to allow the computer device 1000 to communicate with a video card, a sound card, a memory card, a USB device, and others. The computer device 1000 may include a smartphone, a table PC, a smart wearable device, and the like, besides a general desktop computer or a laptop computer.

The processor 1040 may perform a calculation, a command, and a task, and the like. The processor 1040 may a central processing unit (CPU), a microprocessor unit (MCU), a system on chip (SoC), or the like, and may communicate with the image sensor 1010, the display 1020, the memory device 1030, and also other devices connected to the port 1050 through the bus 1060.

The memory 1030 may be a storage medium for storing data required for operation of the computing device 1000 or multimedia data, and the like. The memory 1030 may include a volatile memory such as a random access memory (RAM) or a non-volatile memory such as a flash memory, and the like. As a storage device, the memory 1030 may also include at least one of a solid state drive SSD, a hard disk drive (HDD), and an optical drive (ODD). The input and output device 1020 may include an input device such as a keyboard, a mouse, a touch screen, and the like, and an output device such as a display, an audio output portion, and the like.

The image sensor 1010 may be mounted on a package substrate and connected to the processor 1040 by the bus 1060 or another communication means. The image sensor 1010 may be employed in the computer device 1000 in various forms suggested in the aforementioned example embodiments described with reference to FIGS. 1 to 14.

According to the aforementioned example embodiments, the current circuits for supplying a bias current to column lines of the image sensor may maintain a turn-on state during a readout operation. Thus, noise components occurring by repeatedly turning the current circuits on and off may be significantly reduced, and a readout operation speed may be improved by reducing the settling time required when a readout operation for subsequent pixels starts. Also, by reducing an area occupied by a bias circuit, integration density of the image sensor may increase.

While some example embodiments have been shown and described above, it will be apparent to those skilled in the art that modifications and variations could be made without departing from the scope of example embodiments of the present inventive concepts as defined by the appended claims.

What is claimed is:

1. An image sensor, comprising:
   a pixel array including a first to a fourth pixel groups disposed in a first direction and including two or more pixels among a plurality of pixels, respectively;
   a plurality of column lines extending in the first direction and including a first column line connected to the first pixel group and the second pixel group and a second column line connected to the third pixel group and the fourth pixel group;
   a first current circuit configured to generate a first bias current;
   a second current circuit configured to generate a second bias current;
   a first switch connected between the first column line and the first current circuit;
   a second switch connected between the first column line and the second current circuit;
   a third switch connected between the second column line and the first current circuit;
   a fourth switch connected between the second column line and the second current circuit;
   a first pull-up transistor connected to the first column line; and
   a second pull-up transistor connected to the second column line,
   wherein when the first column line is connected to the first current circuit by the first switch being turned-on, the second column line is connected to the second current circuit by the fourth switch being turned-on.

2. The image sensor of claim 1, wherein each of the first to the fourth pixel groups comprises four pixels arranged in the first direction and a second direction intersecting with the first direction,
   wherein the four pixels comprise two green pixels, a blue pixel, and a red pixel, and
   wherein the two green pixels, the blue pixel, and the red pixel share a floating diffusion node.

3. The image sensor of claim 1, wherein each of the first current circuit and the second current circuit includes transistors, and
   wherein a size of the transistors included in the first current circuit is substantially equal to a size of the transistors included in the second current circuit.

4. The image sensor of claim 3, wherein, for a read operation of a first mode, the first bias current is higher than the second bias current, and during a first period of the read operation of the first mode, the first column line is connected to the first current circuit by the first switch being turned-on, the second column line is connected to the second current circuit by the fourth switch being turned-on and the second switch and the third switch being turned-off.

5. The image sensor of claim 4, wherein, during the first period, the second pull-up transistor is turned-on and the first pull-up transistor is turned-off.

6. The image sensor of claim 5, wherein, during a second period of the read operation of the first mode, the first column line is connected to the second current circuit by the second switch being turned-on, the second column line is connected to the first current circuit by the third switch being turned-on and the first switch and the fourth switch being turned-off.

7. The image sensor of claim 6, wherein, during the second period, the first pull-up transistor is turned-on and the second pull-up transistor is turned-off.

8. The image sensor of claim 7, further comprising:
a multiplexer configured to select one of the first column line and the second column line as a selected column line, and to connect the selected column line to an input terminal of a correlated double sampler.

9. The image sensor of claim 8, wherein, during the first period, the multiplexer selects the first column line.

10. The image sensor of claim 8, wherein, during the second period, the multiplexer selects the second column line.

11. The image sensor of claim 4, wherein, for a read operation of a second mode, the first bias current is equal to the second bias current.

12. The image sensor of claim 11, wherein, during the read operation of the second mode, the first pull-up transistor and the second pull-up transistor are turned-off and the first column line is connected to the first current circuit by the first switch being turned-on, the second column line is connected to the second current circuit by the fourth switch being turned-on.

13. The image sensor of claim 12, further comprising:
a first correlated double sampler and a second correlated double sampler,
wherein, during the read operation of the second mode, the first column line is connected to the first correlated double sampler and the second column line is connected to the second correlated double sampler.

14. An image sensor comprising:
a pixel array including a first pixel group, a second pixel group, a third pixel group and a fourth pixel group arranged in a first direction, and each pixel group including two or more pixels;
a first column line connected to the first pixel group and the second pixel group;
a second column line connected to the third pixel group and the fourth pixel group;
a first current circuit including a first cascade transistor and a first bias transistor connected to each other in serial;
a second current circuit including a second cascade transistor and a second bias transistor connected to each other in serial;
a first switch connected between the first column line and the first current circuit;
a second switch connected between the first column line and the second current circuit;
a third switch connected between the second column line and the first current circuit; and
a fourth switch connected between the second column line and the second current circuit,
wherein when the first switch and the fourth switch are turned-on, the second switch and the third switch are turned-off, and
wherein when the first switch and the fourth switch are turned-off, the second switch and the third switch are turned-on.

15. The image sensor of claim 14, wherein a size of the first cascade transistor is substantially equal to a size of the second cascade transistor, and a size of the first bias transistor is substantially equal to a size of the second bias transistor.

16. The image sensor of claim 14, wherein each of the first pixel group, the second pixel group, the third pixel group and the fourth pixel group includes four pixels arranged 2×2 matrix form,
wherein the four pixels includes four photodiodes and four transfer transistors commonly connected to a floating diffusion node, in each of the first pixel group, the second pixel group, the third pixel group and the fourth pixel group.

17. The image sensor of claim 16, further comprising:
a first pull-up transistor connected to the first column line; and
a second pull-up transistor connected to the second column line.

18. The image sensor of claim 17, wherein when the first switch and the fourth switch are turned-on, the second switch and the third switch are turned-off, the first pull-up transistor is turned-off and the second pull-up transistor is turned-on, and
wherein when the first switch and the fourth switch are turned-off, the second switch and the third switch are turned-on, the first pull-up transistor is turned-on and the second pull-up transistor is turned-off.

19. The image sensor of claim 14, where the first current circuit is responsive to a first bias control signal and the second current circuit is responsive to a second bias control signal.

20. The image sensor of claim 19, further comprising:
a current mirror configured to control the first bias control signal and the second bias control signal.

* * * * *